United States Patent [19]

Amazawa et al.

[11] 4,268,793

[45] May 19, 1981

[54] NOISE ELIMINATING CIRCUIT

[76] Inventors: Kiyoshi Amazawa; Masaharu Mori; Takashi Taniyama, all of 50, Kamitoda, Toda-shi, Saitama-ken, Japan

[21] Appl. No.: 950,567

[22] Filed: Oct. 12, 1978

[51] Int. Cl.³ .................. H03B 1/04; H03K 3/013
[52] U.S. Cl. .................................. 328/165; 328/163; 328/151; 455/222
[58] Field of Search ............... 328/162, 163, 165, 151; 325/473, 474, 475, 478, 479

[56] References Cited

U.S. PATENT DOCUMENTS

| 3,534,282 | 10/1970 | Day | 328/165 X |
| 3,689,845 | 9/1972 | Hepp | 325/473 |
| 3,978,412 | 8/1976 | Frerking | 325/478 |
| 4,154,980 | 5/1979 | Schmidt et al. | 325/473 X |

Primary Examiner—John S. Heyman
Attorney, Agent, or Firm—Wallenstein, Spangenberg, Hattis & Strampel

[57] ABSTRACT

A noise eliminating circuit comprising means for generating a signal having a phase difference with respect to an input signal, means for simultaneously cutting off the input signal and the phase difference signal at the time when a noise is entering the circuit, means for retaining the levels of the respective signals that have developed immediately before said signals are cut off, and means for outputting a retained signal of one level by adding the same to a retained signal of the other level at a given time constant, thereby to make up for the signal interruption, preventing deterioration in tone quality caused by such signal interruption.

6 Claims, 14 Drawing Figures

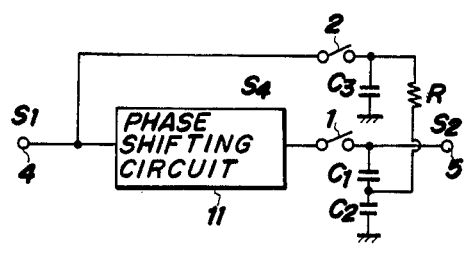
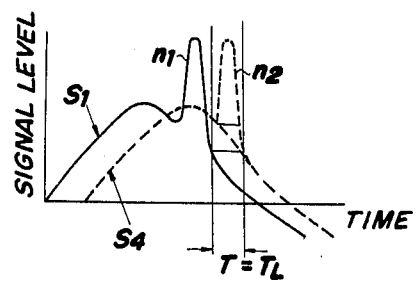
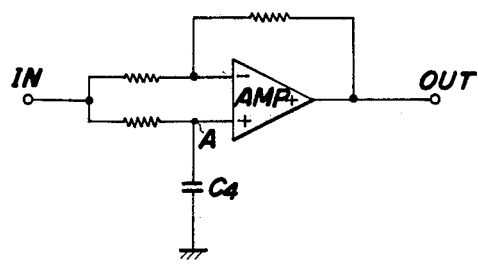
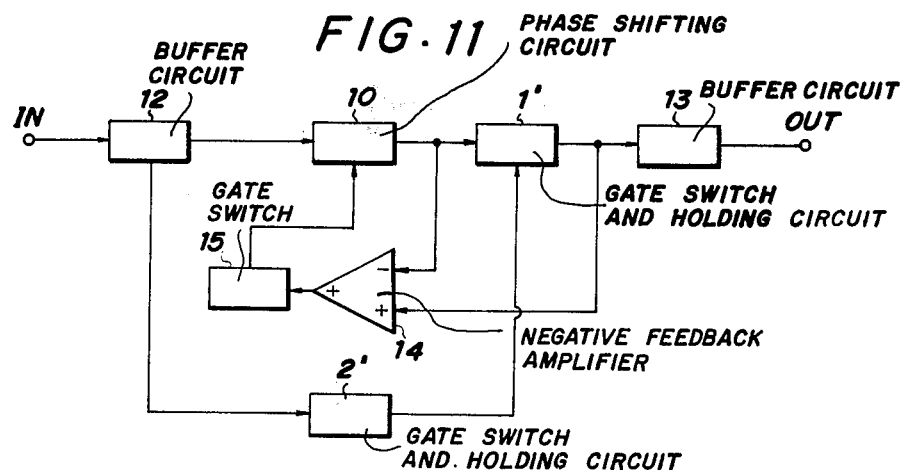

NOISE ELIMINATING CIRCUIT

BACKGROUND OF THE INVENTION

1. Field of the Invention

This invention relates to improvements in noise eliminating circuits especially useful in AM radio receivers and CB transceivers.

2. Description of the Prior Art

One common form of noise eliminating circuit comprises a noise responsive gate circuit in the main signal path which opens the circuit during the presence of noise pulses superimposed on the desired signal. However, since the input signal is absent during the noise pulse, deterioration in tone quality produced by the interrupted signal waveform results.

It is, therefore, the object of this invention to eliminate or substantially reduce the signal deterioration produced by this prior noise eliminating circuit so that noise elimination or reduction is achieved without substantial deterioration of tone quality.

SUMMARY OF THE INVENTION

To achieve this purpose, the present invention produces a second signal from the input signal phase shifted with respect to the input signal, and the two signals are coupled to signal storage elements like capacitors through noise responsive gate circuits which are closed during the presence of noise pulses. The signals developed across the storage elements are intercoupled and fed to a common input terminal.

BRIEF DESCRIPTION OF THE DRAWINGS

FIG. 8 is a partially block diagram showing still further embodiment of the invention;

FIG. 9 is a waveform illustrating the operation of this embodiment of the invention;

FIG. 10 is a diagram showing one embodiment of a phase shifting circuit which may be used for the phase shifting circuits shown in block form in various Figs. of the drawings.

FIGS. 11 and 12 are diagrams that show another embodiment of this invention.

DETAILED DESCRIPTION OF THE INVENTION

Figure 1:
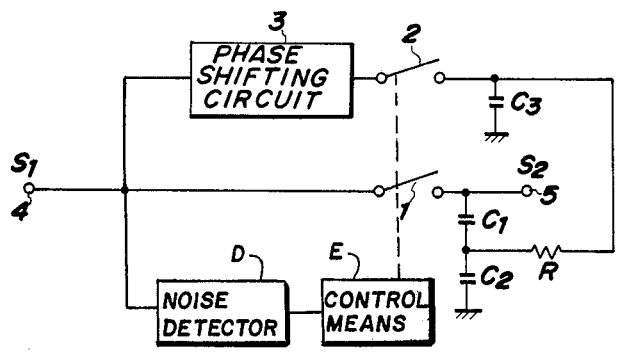
FIG. 1 is a skeleton diagram showing one embodiment of this invention.
Figure 2:
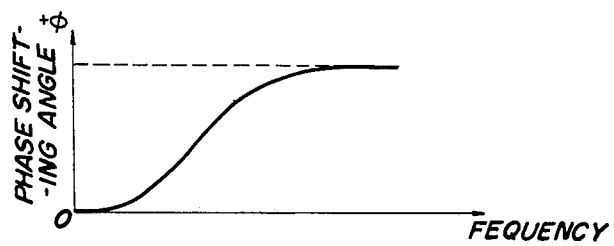
FIG. 2 is a graph showing one example of the phase lead characteristics of the phase shifting circuit thereof.

This invention is now described by reference to the embodiments illustrated in the attached drawings. FIG. 1 shows one embodiment of a noise eliminating circuit using the signal compensation system according to this invention. In the Figure, 1 and 2 are normally closed noise-responsive gate switches which open during a noise pulse superimposed upon the input signal $S_1$ on input terminal 4. The circuit of FIG. 1 further includes a phase advancing circuit 3 coupled between terminal 4 and gate switch 2. Gate switches 1 and 2 are shown diagrammatically as contacts controlled by a control means indicated by a box E. The contacts shown together with the control means are, as is apparent from exemplary circuits of the invention shown in the drawings, generally transistor control circuits or the like. Gate switch 2 is connected between the output of phase advancing circuit 3 and a grounded capacitor $C_3$ connected through resistor R to the juncture of series connected capacitors $C_1$ and $C_2$ connected between the output of gate switch 1 and output terminal 5. The input of gate switch 1 is connected to input terminal 4. The phase advancing circuit 3 has a gain of 1, and as shown in FIG. 2, its output phase is in lead with respect to the frequency f. The gate switches 1 and 2 are usually closed, and they are simultaneously opened only in the period when noise interferes with the circuit. To this end, any suitable noise detecting circuit may be provided which is coupled to the input signal $S_1$ and produces an output signal coextensive in time with each noise signal. This output is fed to the control switch means to open the gate switch during the noise signals. If the off-time is T, the frequency $f_O$ (a frequency for compensation limit) at a phase lead angle of $\pi/2$ obtained by the phase lead circuit 3 is given by $f_O = 1/4T$.

If the gate switch 1 is opened, the level of voltage $V_1$ that has developed immediately before turning said gate switch off is retained in the capacitors $C_1$ and $C_2$, provided however that the signal source impedance connected to the input terminal 4 is substantially zero, and the load impedance connected to the output terminal 5 is substantially infinite.

At the same time, the gate switch 2 is opened, and the voltage $V_2$ is likewise retained in the capacitor $C_3$, provided however that impedance of the phase lead circuit 3 is substantially zero and the load impedance of the gate switch 2 is substantially infinite.

The capacitor $C_2$ is charged through the resistor R, with the voltage $V_2$ retained in the capacitor $C_3$. The potential change Vs in the capacitor $C_2$ due to its connection to capacitor $C_3$ through resistor R is given by the following equation:

$$Vs = (V_2 - V_1)(1 - e^{\frac{-t}{C_2 R}})$$

This potential change Vs is outputted by way of the capacitor $C_1$ as long as each gate switch remains opened. Thus, not only the input signal $S_1$ and the noise superimposed thereon are eliminated by opening the gate switch 1 when the noise interferes with the circuit, but the potential change Vs is outputted for the time during which the switch 1 is nonconductive to make up for the signal interruption, attaining not only elimination of the noise but compensation of the signal as well. The potential change Vs is, as can be seen from FIG. 3, very close to the original input signal without the noise expected during a period T corresponding to the noise-elimination period (switch-off period).

Figure 3:
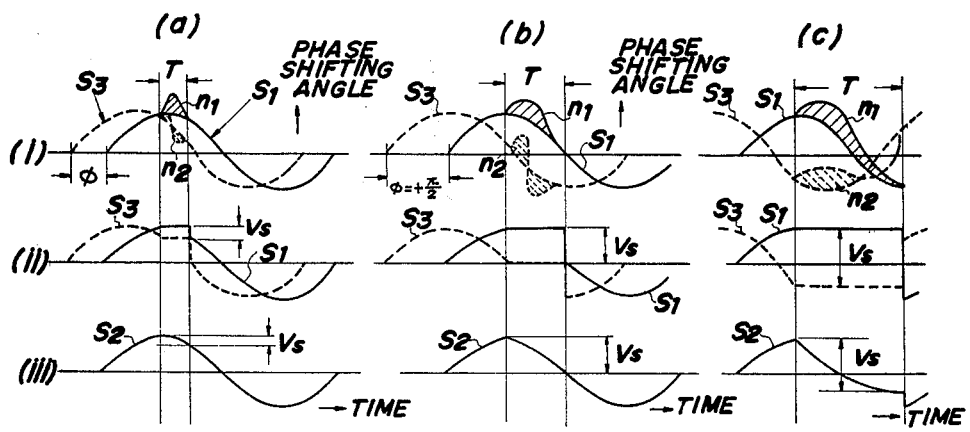
FIGS. 3(a), 3(b) and 3(c) show various waveforms illustrating the operation of the above embodiment of the invention under different noise pulse conditions.

FIGS. 3(a), (b) and (c) illustrate the signal compensation as achieved by the aforedescribed circuit in the cases of $f = f_O/2$ (a phase lead of about $\pi/4$), $f = f_O$ (a phase lead of $\pi/2$) and $f = 2f_O$ (a phase lead of about $2\pi/3$), respectively. In each figure, (i) indicates that noises $n_1$ and $n_2$ have entered the input signal $S_1$ and the phase lead circuit output S₃, (ii) indicates the operation of the capacitor for retaining a voltage level in the period when the gate switch remains off, and (iii) shows the status after signal compensation is achieved by means of Vs. During the period T as shown in the figure, the switches 1 and 2 are turned off, i.e., opened so that not only the noises $n_1$ and $n_2$ but the signals $S_1$ and $S_3$ on which the noises are superimposed are eliminated. This would produce an interruption in the signals during the period T. In the present invention, however, as shown in FIG. 3 (ii), the potential change Vs is applied, during said period T, to the capacitor $C_2$ from the capacitor $C_3$ through the resistor R and outputted by way of the capacitor $C_1$. The potential change Vs has a curve very approximate to the original signal $S_1$ during the term T, which attenuates from the voltage $V_2$ (output level of the phase lead circuit 3 which has been developed just before turning the gate switch 2 off and is charged in the capacitor $C_3$) to the voltage $V_1$ (the level of the signal $S_1$ which has been developed immediately before the gate switch 1 is turned off and is charged in the capacitors $C_1$ and $C_2$). As these figures clearly show, in the case of $f < < f_O$, the smallness in the degree of phase lead allows level retention to be performed in entirely the same manner as in the case of ordinary level retention, thus accomplishing complete elimination of a signal distortion.

Figure 4:
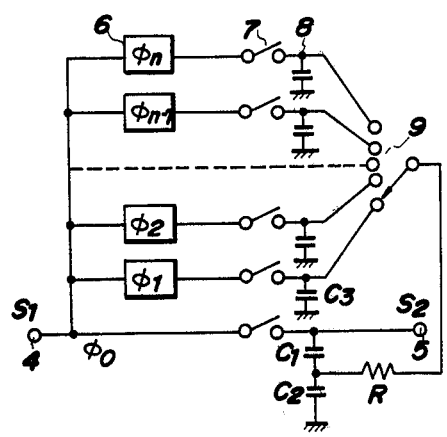
FIG. 4 is a partially block diagram showing another embodiment of this invention.
Figure 5:
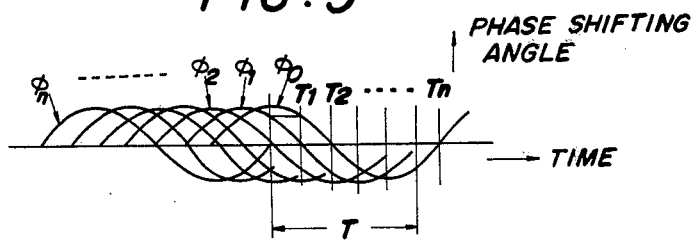
FIG. 5 is a waveform illustrating the operation of this embodiment of the invention.

In the case of $f > > f_O$ where the off-time of the gate switch with respect to the wavelength is long, a plurality of phase lead circuits 6, gate switches 7 and level retaining capacitors 8 may be arranged as shown in FIG. 4, wherein the capacitors 8 are sequentially connected to a resistor R by means of a scanner switch 9. In other words, the off-time of the gate switches is divided into $T_1, T_2 \ldots T_n$, and the signal waveforms are compensated as shown in FIG. 5, with the phase lead angles corresponding to those divided off-times being $\phi_1-\phi_n$. As FIG. 5 clearly shows, this arrangement provides further reduction of the signal distortion.

If the frequency such that $\phi_n-\phi_{n-1}$ equals $\pi/2$ is supposed $f_n$, the following equation is obtained:

$$f_n = n \frac{1}{4T} = n \cdot f_O$$

which means, given a constant off-times of the gate switch, signals having frequencies up to substantially n times the frequency corresponding to said off-time can be compensated. Conversely, if the frequency to be processed is given, the off-time of the gate switch can be extended by n times.

Figure 6:
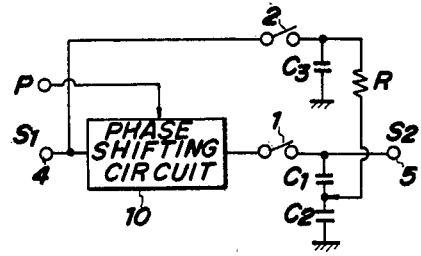
FIG. 6 is a partially block diagram showing still another embodiment of this invention.
Figure 7:
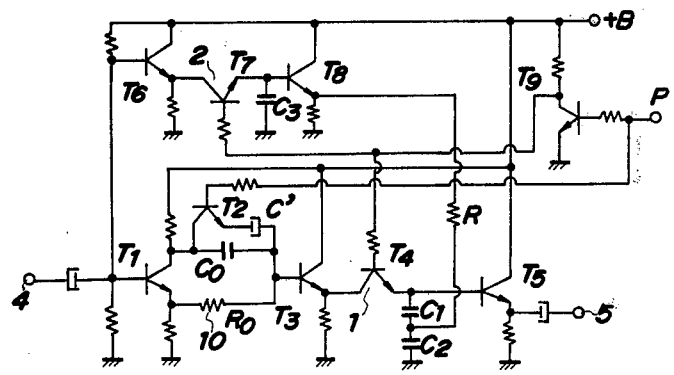
FIG. 7 is a circuit diagram showing one example of the embodiment shown in FIG. 6.

By reference to FIG. 6, a noise eliminating circuit according to the signal compensation system of this invention using a phase lag circuit is now described. In FIG. 6, if a noise enters the circuit, the noise is extended timewise in a phase lag circuit 10, and therefore, as long as the noise exists, a pulse for stopping phase-shifting operation is applied so as to switch the phase characteristics of said phase lag circuit to a flat one. FIG. 7 shows one example of a specific circuitry for this purpose. In the Figure $T_7$ and $T_4$ are gating transistors, $T_3$, $T_5$, $T_6$ and $T_8$ are buffering emitter follower transistors, and $T_2$, as turned on when a pulse P is applied, connects a capacitor C' to $C_0$ in parallel so as to render flat the phase lag characteristics due to a resistor $R_0$ and capacitor $C_0$. The gating transistors $T_4$ and $T_7$ are usually on, but upon application of the pulse P to a transistor $T_9$ which is then turned on, both gating transistors are turned off simultaneously.

FIG. 8 shows another embodiment of this invention using a delay element 11, wherein the off-time T of the gate switch is rendered equal to the delay time $T_L$ of the delay element 11. As will be clear from FIG. 9, this embodiment is advantageously applied to compensation of a signal having a frequency of 1/4T or less.

The embodiment illustrated in FIG. 7 is thus capable of controlling the phase characteristics of a phase-shifting circuit upon input of a pulsive noise and inhibiting extension of a noise period at the output, but the same purpose can be achieved by a phase switching circuit which will be described hereinafter. If a phase shifting signal outputted from a phase switching circuit is applied to point A in the phase shifting circuit of the type shown in FIG. 10, the function of a capacitor $C_4$ is deactivated to switch the preset phase characteristics of the phase shifting circuit.

FIG. 11 is a block diagram of a noise eliminating circuit incorporating the phase switching circuit of this invention. As comparison with FIG. 1 shows, the phase switching circuit is composed of a loop comprising a phase shifting circuit 10, a first gate switch and holding circuit 1', a negative feedback amplifier circuit 14, and a gate switch circuit 15. Reference numerals 12 and 13 represent buffer circuits. The first input (−) of the negative feedback amplifier circuit 14 is connected to the input of the gate switch and holding circuit 1', whereas the second input (+) is connected to the output of said gate switch and holding circuit 1'. The output of the negative feedback amplifier circuit 14 is connected to the phase shifting circuit (point A in FIG. 10) through the gate switch circuit 15 that switches from off to on upon application of a noise detecting signal.

If no noise exists in an input signal to be provided to the input terminal IN, the gate switch and holding circuits 1' and 2' are closed so that the signal passing through the gate switch and holding circuit 2' does not act upon the signal passing through the gate switch and holding circuit 1', and on the other hand, the gate switch circuit 15 is in an open state. Accordingly, the input signal sequentially passes the buffer circuit 12, the phase shifting circuit 10, the gate switch and holding circuit 1' and the buffer circuit 13 so as to be outputted from the output terminal OUT with the same waveform being maintained.

In contrast, if a noise exists in the input signal to be applied to the input terminal IN, both gate switch and holding circuits 1' and 2' are closed, and as described hereinbefore, the gate circuit 1 eliminates the noise by effecting phase compensation in response to a compensating signal from the gate switch and holding circuit 2' and provides the buffer circuit 13 with an output signal of the same waveform as that of the input signal. In this mode, the gate switch circuit 15 is turned on in response to the noise detecting signal, whereupon the loop starting from the phase shifting circuit 10, past the negative feedback amplifying circuit 14 and the gate circuit 15 and ends at the phase shifting circuit 10 forms a negative feedback path, and because the ngative feedback amplifier circuit 14 is a differential amplifier, a process of negative feedback continues within this loop until the input signal to the gate switch and holding circuit 1' becomes the same as the output signal therefrom, with the result that the output of the negative feedback amplifier circuit 14, that is, a phase shifting signal, is inputted to the phase shifting circuit 10. If the input and output signals of the gate switch and holding circuit 1' were of the same waveform, the output of the negative feedback amplifier circuit 14 would be zero and would have no effect on the phase shifting circuit 10, but in fact, a noise component exists in the input signal to the gate switch and holding circuit 1 whereas such noise component has been eliminated from the output signal from the said gate switch and holding circuit 1', and so, the difference between these signals or a signal component of the noise is amplified by the negative feedback amplifier circuit 14 to be applied as a phase shifting signal to the phase shifting circuit 10 through the gate circuit 15. This means that the phase characteristics of the phase shifting circuit 10 is switched by the phase shifting signal to one that is independent of the preset characteristics, so that the extension of the noise period at the output of the phase shifting circuit 10 is inhibited.

Figure 12:
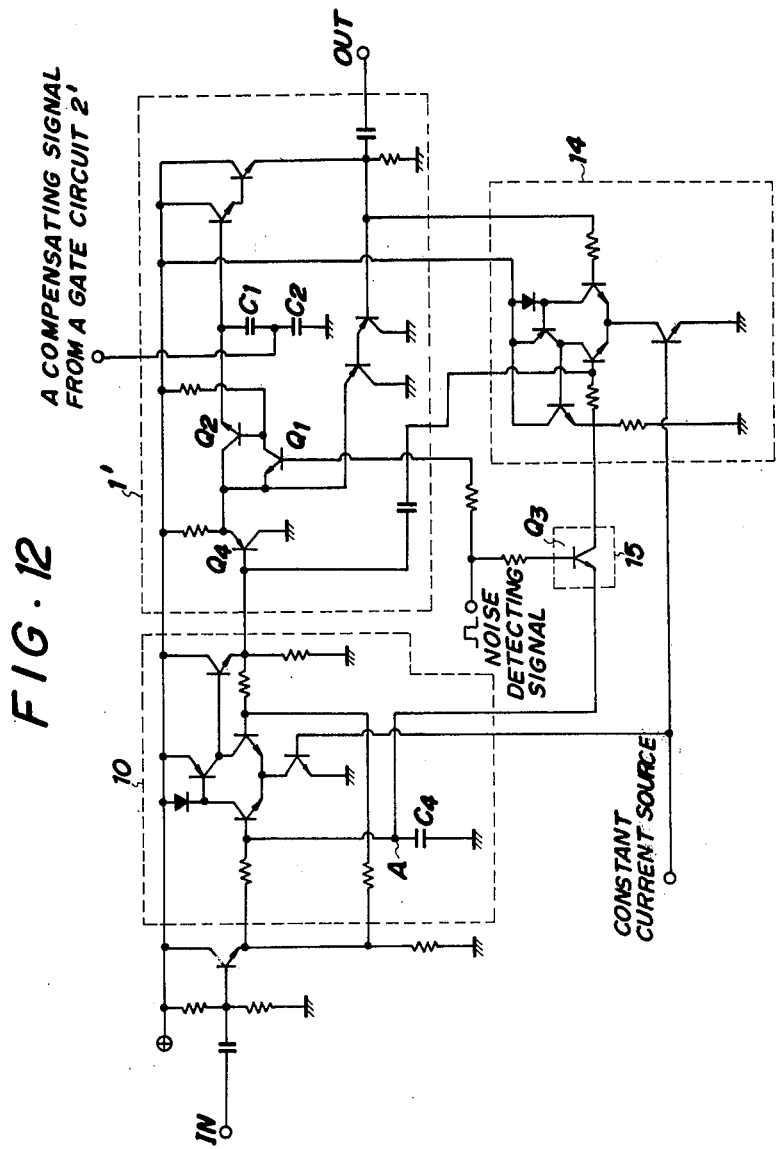

FIG. 12 is a specific circuit diagram of the phase compensating circuit set forth in FIG. 11, with the blocks corresponding to the counterparts shown in FIG. 11 being indicated by broken lines. According to this diagram, in the absence of a noise detecting signal, a transistor $Q_1$ does not conduct and therefore a transistor $Q_2$ conducts, with the result that the input signal to the gate switch and holding circuit 1', as its level is being retained in capacitors $C_1$ and $C_2$, is outputted from the output terminal OUT without change in the waveform. In this mode, a transistor $Q_3$ of the gate circuit 15 remains non-conductive and therefore the phase shifting circuit 10 is in no way affected by the output from the negative feedback amplifier circuit 14.

On the other hand, in the presence of a noise detecting signal, the transistor $Q_1$ conducts and therefore the transistors $Q_2$ does not conduct, with the result that the potential change determined by the signal level retained in the capacitors $C_1$ and $C_2$ as well as by the level of the compensating signal from the gate circuit 2' is outputted at the output terminal OUT. In addition, in response to the signal difference between such output signal and the input signal to the base of a transistor $Q_4$, a phase shifting signal is generated at the output of the negative feedback amplifier circuit 14. In this mode, since the transistor $Q_3$ is in conductive state due to the noise detecting signal, the phase shifting signal is applied to point A in order to switch the phase characteristics of the phase shifting circuit 10.

As illustrated in detail above, this embodiment is capable of preventing extension of a noise period outputted from the phase shifting circuit, and therefore, the noise eliminating effect of a phase compensating circuit is exhibited to the fullest without need of extending the switching period of the gate circuit for noise elimination.

As will be understood from the foregoing discussion, this invention achieves noise elimination without causing interrupted sounds while reducing a distortion and improving the tone clarity. In addition, noise elimination is free from incidental inconveniences because it is achieved by processing the very signal that is desired to be eliminated.

Further in addition, as compared with the conventional type of noise elimination circuit that simply relies on level retension, this invention is capable of improving the tone quality at all frequencies regardless of $f_0$.

This invention is advantageously used for eliminating noise from AM radio receivers or CB transceivers, but it is also applicable to elimination of noise from multi-output signals of FM receivers.

We claim:

1. A noise eliminating circuit comprising an input terminal; an output terminal; first gate switch means coupled between said input and output terminals; control means for opening said first gate switch means for cutting off an input signal applied to said input terminal in response to a noise entering the circuit and a first holding means coupled to said first gate switch means for holding the output thereof immediately before the same is opened; phase shifter means coupled to the input terminal for generating a phase displaced signal having a phase displacement with respect to said input signal; phase displaced signal gate switch means controlled by said control means and to be opened with said first switch means and coupled to said phase shifter means; second holding means for holding the output of the phase displaced signal gate switch means immediately before such gate switch means is opened; and interconnecting circuit means coupled between said first and second holding means for adding the output of said second holding means and the output of said first holding means at a given time constant, thereby compensating the input signal appearing at the output terminal with the output of said second holding means when the input signal is cut off to eliminate the noise.

2. A noise eliminating circuit according to claim 1 wherein the phase shifter means includes a phase lead circuit.

3. A noise eliminating circuit according to claim 1 wherein the phase shifter means includes a phase lag circuit.

4. A noise eliminating circuit according to claim 1 which further includes scanner means coupled to said interconnecting circuit means, and in which said phase shifter means includes a plurality of separate phase leading circuits each being coupled to the input terminal, said second gate switch means includes a plurality of separate first gate switch circuits each being coupled to a different one of said phase leading circuits, and said scanner means adapted to scan said second holding means sequentially.

5. A noise eliminating circuit according to claim 3 which further comprises means for switching the phase characteristic of said phase lag circuit to a flat one in response to a noise entering the circuit, whereby the noise may not be expanded in the phase lag circuit.

6. A noise eliminating circuit according to claim 1 which further comprises negative feedback means connected to the input and output of said phase displaced signal gate switch means for providing a negative feedback signal corresponding to the difference between the input and output signals of said first gate switch means, and gate switch means for passing said negative feedback signal from said negative feedback means to said phase shifter means in response to a noise entering the circuit, thereby changing the phase characteristics of said phase shifter means.

* * * * *